United States Patent [19]

Lee

[11] Patent Number: 5,963,503
[45] Date of Patent: Oct. 5, 1999

[54] SYNCHRONOUS SYSTEMS HAVING SECONDARY CACHES

[75] Inventor: Young-Dae Lee, Seoul, Rep. of Korea

[73] Assignee: Samsung Electronic Co., Ltd., Suwon, Rep. of Korea

[21] Appl. No.: 09/188,075

[22] Filed: Nov. 9, 1998

[30] Foreign Application Priority Data

Nov. 15, 1997 [KR] Rep. of Korea ................. 97-60274

[51] Int. Cl.[6] ........................................... G11C 8/00
[52] U.S. Cl. ................. 365/233; 365/230.03; 365/23.06
[58] Field of Search ............................. 365/233, 230.03, 365/230.06

[56] References Cited

U.S. PATENT DOCUMENTS

| | | | |
|---|---|---|---|
| 5,808,959 | 9/1998 | Kengeri et al. | 365/233 |
| 5,812,491 | 9/1998 | Shinozaki et al. | 365/233 |
| 5,835,424 | 11/1998 | Kikukawa et al. | 365/233 |
| 5,848,021 | 12/1998 | Sugibayashi | 365/230.06 |

*Primary Examiner*—David Nelms
*Assistant Examiner*—Tuan T. Nguyen
*Attorney, Agent, or Firm*—Jones Volentine, L.L.P.

[57] ABSTRACT

A cache memory uses at least two synchronous memory devices operable of responding to an external clock signal and performing a bank operation mode. The memory device includes a control logic for generating an informing signal denoting a non-selection of the memory device, the informing signal responding to the internal clock signal, a first decoder generating a first selection signal to designate one of the second word lines and a second selection signal to designate one of the first word lines corresponding to the first word line which is preliminarily selected, a control signal generating circuit receiving the informing signal and generating a control signal responding to the internal clock signal, and a second decoder for receiving the first and second selection signals and for selecting the first word line, when the memory device is being selected. When the memory device goes to a selection state from a non-selection state, the control signal is enabled until the first and second selection signals are applied to the second decoder, during a cycle time of the informing signal.

2 Claims, 7 Drawing Sheets

SYNCHRONOUS SYSTEMS HAVING SECONDARY CACHES

FIELD OF THE INVENTION

The present invention relates to an electronic synchronous system, and more particularly to a synchronous system having semiconductor memory devices which is employed therein as secondary caches.

BACKGROUND OF THE INVENTION

Static random access memory (SRAM) devices are usually employed in computer systems as cache memories in order to carry out data accessing operations between main memories such as dynamic random access memories (DRAM) and central processing units. Basically, central processing units include primary cache memories therein, and secondary cache memories are positioned at the outside of the central processing unit. As well known, SRAM devices are usually used in computer systems as cache memories. When such a SRAM is employed in the system as the secondary cache apparatus, there is an important and specific function therein that is called a depth expansion mode (or a bank operation mode of a memory system which includes at least two memory devices sharing data buses on a single integrated circuit board; each memory device is referred to as one bank therein). Data read from bank are transferred to the shared data buses after the other data read from the other bank was provided to the shared data buses, so that an output capacity therethrough can be figure out as being available of being expanded to a data structure of two times. Assuming that one of the bank (or one SRAM device) is designed to create a data capacity of 32 bits in one cycle time, the two bank operations make twice expanded data capacity of 64 bits.

During the bank operation mode, the first bank generates output data while the second bank is not being selected, or the first bank is non-selected while the second bank is selected to generate output data thereof. Such a alternative activations between two banks is repeatedly carried out during the bank operation mode for which each bank is changed from a selection state to a non-selection state, or from a non-selection state and a selection state. A bank forced into the non-selection state retains a high impedance, by which a section word line (or a row decoding path) thereof is not activated in order to make memory cells of the non-selected bank be not influenced from a data accessing operation with memory cells of the selected bank. Approximately, a rate of current consumption in the selected bank is generally up to ▢ through ⅕ of that in the selected bank.

FIG. 1 shows schematic configurations of a control logic and a section word line decoding, for the purpose of controlling the non-selected banks during the bank operation mode. As shown in FIG. 1, control logic circuit 100 receives control signals CS1B, CS2B, CS2, ADVB, ADSCB and ADSPB, and then generates non-selection signal DESELECTB which is applied to section word line decoder 120. A bank receiving the non-selection signal DESELECTB does not perform a write or a read operation. Section word line decoder 120 to select a section word line SWL is activated in the selection state, or not activated in the non-selection state, in response to non-selection signals DESELECTB generated from control logic circuit 100.

As non-selection signal DESELECTB is made from combining the control signals CS1B, CS2B, CS2, ADVB and ADSPB in a logical accessing, there is an speed limit in generating the non-selection signal. For instance, comparing the time until DESELECTB is generated after an address input, tDES, to the time until a main word line responds to a decoding non-selection information for itself, tMWL. FIG. 2A shows that tDES runs to about half of tMWL in an operating condition of a low frequency, while FIG. 2B shows that tDES terminates at the most end of tMWL in a high frequency operation mode. Since the section row decoder 120 responds to DESELECTB in order to activate section word line SWL, the generation time of DESELECTB, tDES, is an inevitable time element being consumed in addressing the section word line.

Therefore, when the bank operation mode puts a bank into the selection state from the non-selection state, tDES may cause tSWL to be delayed in a higher frequency operation system. As shown in FIG. 2B, nevertheless tMWL and tSWL become more shortened as an operating frequency is more higher, tDES retains a constant value. The constant-retained tDES even in a high frequency operating system would make tSWL be delayed as much as being occupied by tDES throughout the time lapsing period thereof. As a result, an activation of a selected word line is more later, and thereby there would be a poor margin for a write operation in a lower power supply, or a malfunction in writing. Furthermore, a mis-alignment between activation times of sense amplifiers and word lines causes a glitch on data output paths and a shift of clock access time.

SUMMARY OF THE INVENTION

The present invention is intended to solve the problems. And, it is an object of the invention to provide a synchronous memory device capable of selecting word line in a shortened time irrespective of presence of an activation time of a non-selection signal when a bank is put into a selection state from a non-selection state in a bank selection mode.

In order to accomplish those objects, a synchronous memory device operable of responding to an external clock signal includes a memory cell array having a plurality of memory cells arranged in a matrix formed of rows and columns, a plurality of first and second word lines, a connection ratio of the first and second word lines being 1:n (n is at least greater than 1), a clock generator for generating an internal clock signal responding to the external clock signal, a control logic for generating an informing signal denoting a non-selection of the memory device, the informing signal responding to the internal clock signal, a first decoder for receiving row address signals to designate one of the first word lines, and for generating a first selection signal to designate one of the second word lines and a second selection signal to designate one of the first word lines corresponding to the first word line which was preliminarily selected, a control signal generating circuit for receiving the informing signal and for a control signal responding to the internal clock signal, and a second decoder for receiving the first and second selection signals and for selecting the first word line, when the memory device is being selected. When the memory device goes to a selection state from a non-selection state, the control signal is enabled until the first and second selection signals are applied to the second decoder, during a cycle time of the informing signal.

Another preferred feature of the invention is a system having a processing unit and a cache memory at least formed of two synchronous memory devices, the synchronous memory device including a memory cell array having a plurality of memory cells arranged in a matrix formed of rows and columns, a plurality of first and second word lines, a connection ratio of the first and second word lines being 1:n (n is at least greater than 1), a clock generator for generating an internal clock signal responding to the external clock signal, a control logic for generating an informing signal denoting a non-selection of the memory device, the informing signal responding to the internal clock signal, a first decoder for receiving row address signals to designate one of the first word lines, and for generating a first selection signal to designate one of the second word lines and a second selection signal to designate one of the first word lines corresponding to the first word line preliminarily selected, a control signal generating circuit for receiving the informing signal and for a control signal responding to the internal clock signal, and a second decoder for receiving the first and second selection signals and for selecting the first word line, when the memory device is being selected, whereby, when the memory device goes to a selection state from a non-selection state, the control signal is enabled until the first and second selection signals are applied to the second decoder, during a cycle time of the informing signal.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF THE PREFERRED EMBODIMENTS

Hereinbelow, applicable embodiments of the invention will be as follows, with the appended drawings.

Figure 4:
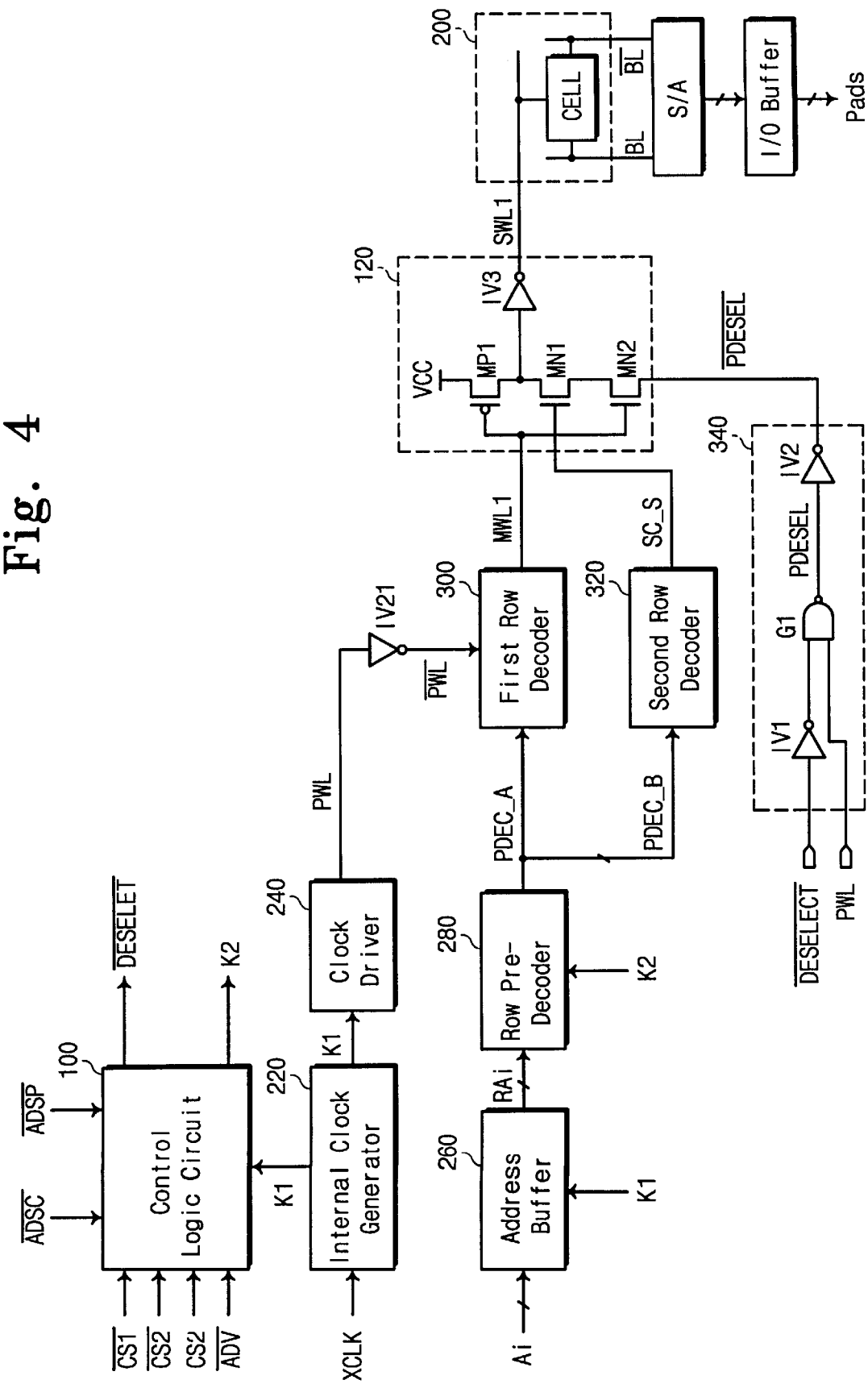
FIG. 4 is a block diagram showing an internal construction of the synchronous memory device of FIG. 3.

Referring to FIG. 4, control signal generating circuit 340 generates pulsed control signal PDESELB that sets section word line decoder 120 into a stand-by state prior to an addressing of a section word line when a non-selection state changes to a selection state. The control signal PDESELB prevents a selection of a section word line from being delayed when the non-selection state changes to the selection state in a high frequency operation.

Figure 3:
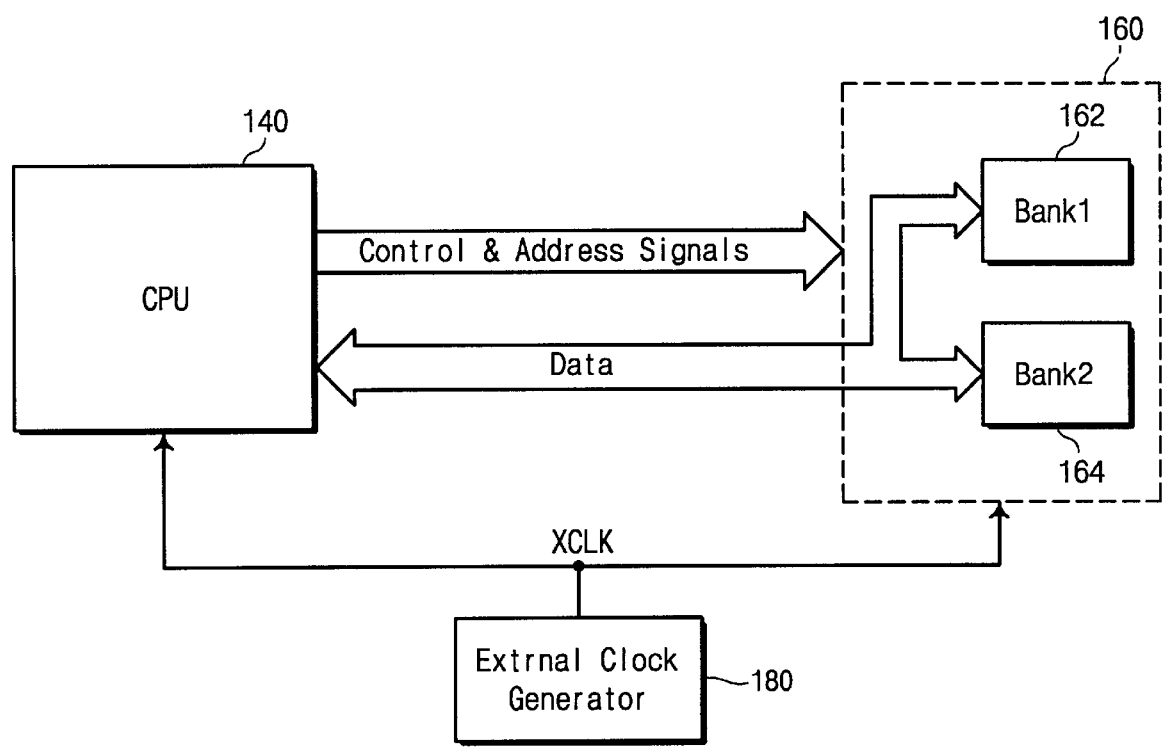
FIG. 3 shows a schematic illustrating a construction ofto form a system employing synchronous memory devices, according to the invention.

FIG. 3 shows a construction of a system using synchronous memory device according to the invention. Referring to FIG. 3, the system includes central processing unit 30 and cache memory 160 formed oftwo banks 162 and 164. It is well known that the two banks are synchronous memory devices typically such as static random access memory (SRAM) devices operable of responding to an external clock signal XCLK. Such SRAM devices are generally referred to as synchronous SRAMs or burst SRAMs. As an alternative one of the two banks 162 and 164 is established either in a selection state or a non-selection state when cache memory 160 is being operable in a bank operation mode (or a depth expansion mode), a selected bank performs read and write operations in response to control signals CS1B, CS2B, CS2, ADVB, ADSCB and ADSPB while those operations in a non-selection bank are stayed at disable states in which there is no occurrence of read and write operations. CS1B, CS2B and CS2 are chip selection signals for activating the banks corresponding to selection state in a bank operation mode, and ADVB, ADSCB and ADSPB are control signals relevant to burst operations which determine the number of data bits generated from data output pins in one time.

FIG. 4 shows a functional construction of a synchronous memory device, i.e., a bank of FIG. 3, which can overcome the problem that an activation time of section word line SWL in a bank, tSWL, non-selection signal DESELECTB. Referring to FIG. 4, SRAM as the synchronous memory aforementioned has control logic circuit 100, memory cell array 200, internal clock generator 220, clock driver 240, address buffer 260, row pre-decoder 280, first row decoder 300, second row decoder 320, section word line decoder 120 and control signal generator 340.

Figure 1:
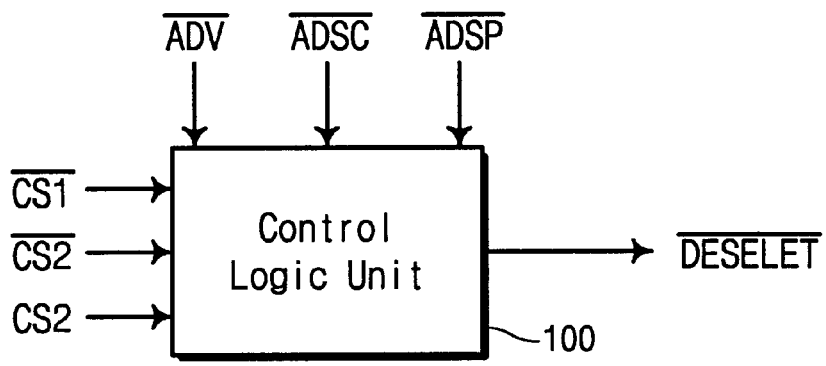
FIG. 1 shows a control logic circuit and a section word line decoder, controlling a non-selected bank, in a conventional art.
Figure 1:
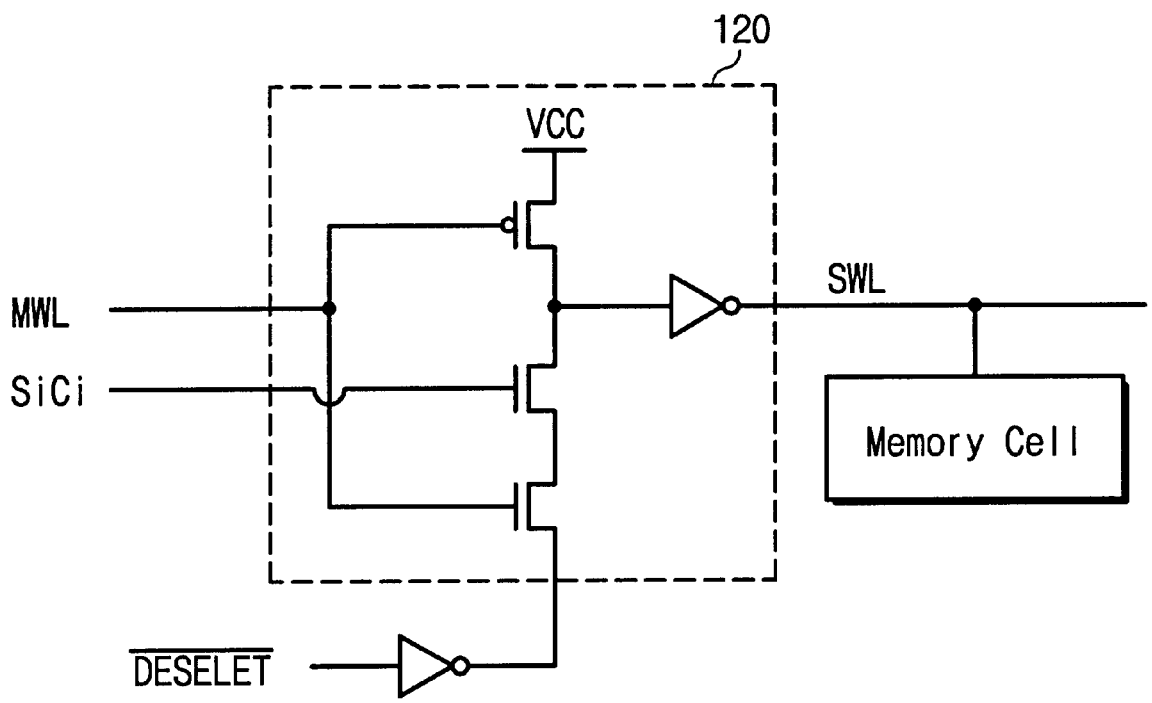
Figure 2A:
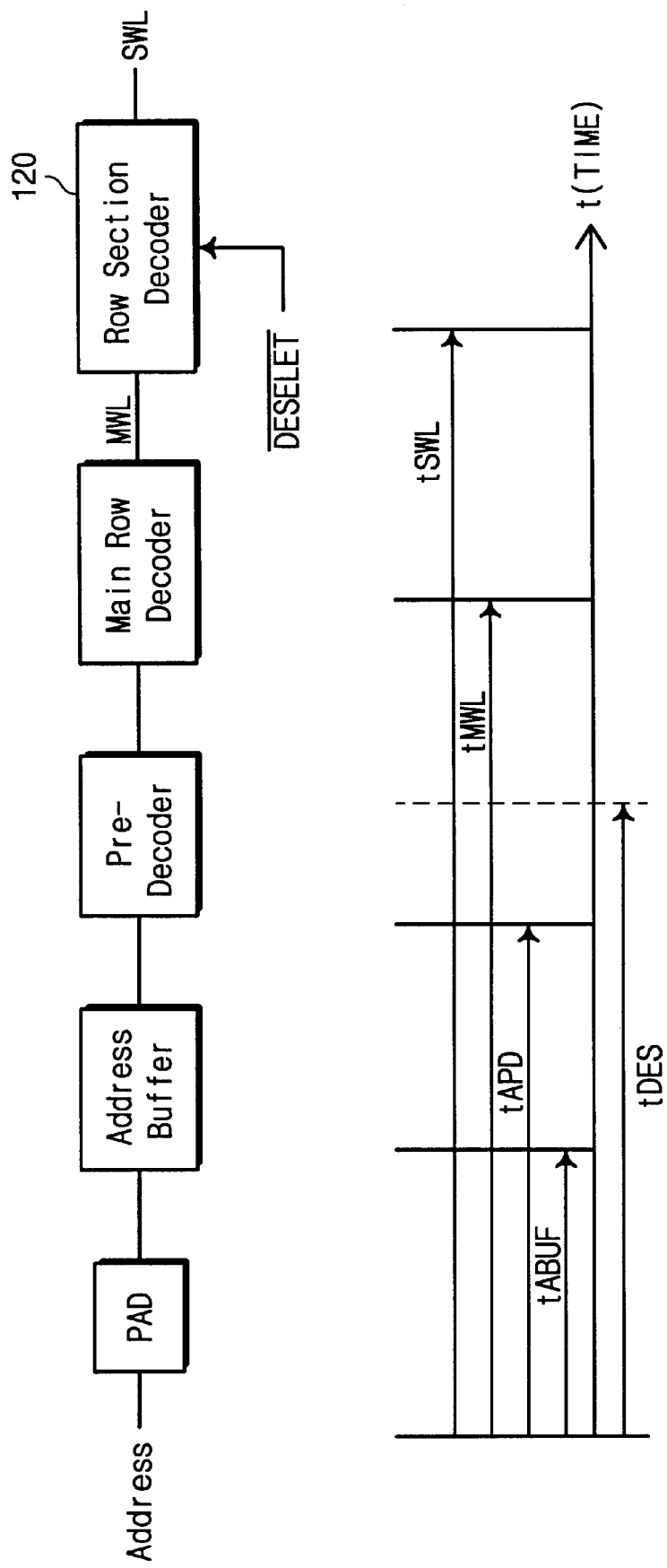
FIGS. 2A and 2B are schematics comparing generating times of a non-selection signal in the circumstance of a low frequency operation with that of a high frequency operation.
Figure 2B:
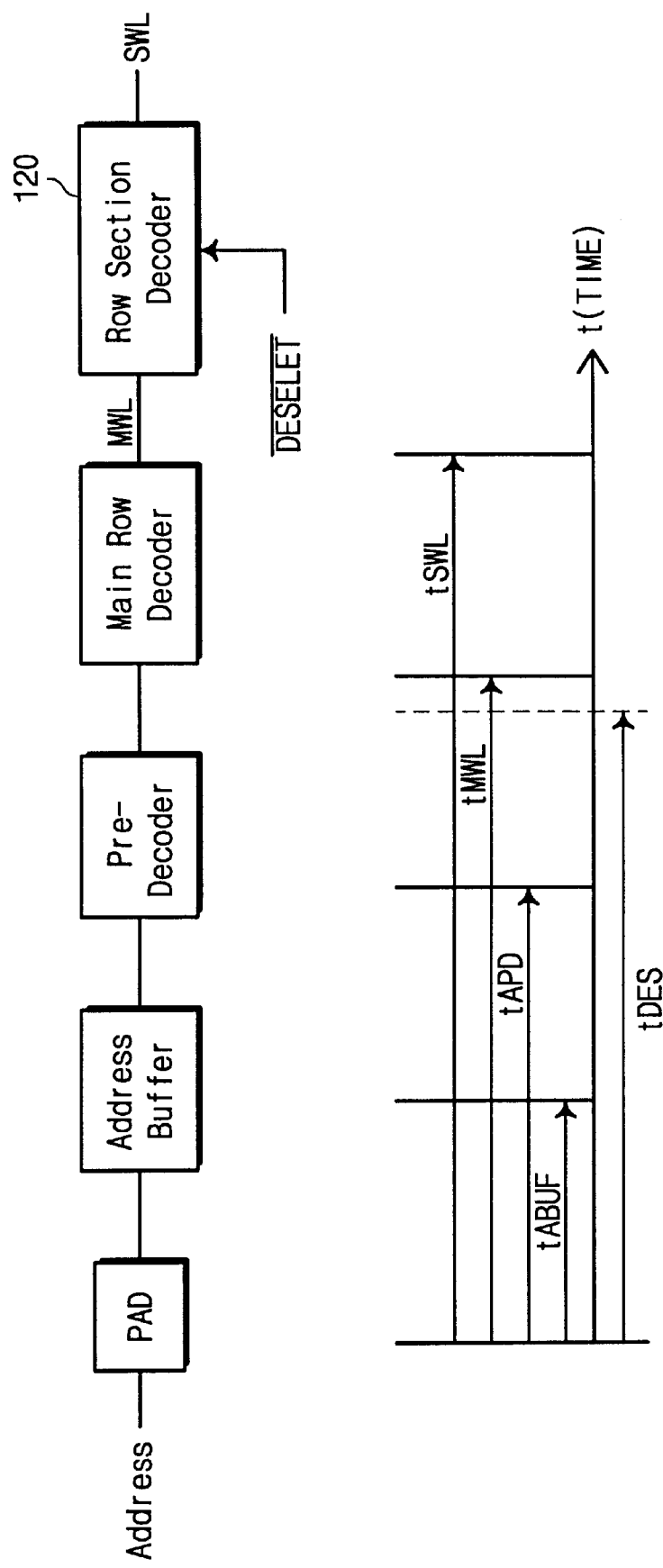

Control logic circuit 100 is the same with that of FIG. 1, generating non-selection signal DESELECTB in response to the chip selection and burst control signals CS1B, CS2B, CS2, ADVB, ADSCB and ADSPB. Memory cell array 200 is composed of plural memory cells (i.e., SRAM cells) arranged in a matrix of rows and columns, plural section word lines SWLm and plural main word lines MWLn. It should be understood that a multiplicity of section word lines SWLm correspond to one of main word lines MWLn, that is, the connecting ratio of section word line vs main word line is X:1. Internal clock generator 220 generates first internal clock signal K1 in response to external clock signal XCLK provided by external clock generator 180. Address buffer 260 converts external address signals Ai of TTL levels to row address signals RAi of CMOS levels.

Figure 5:
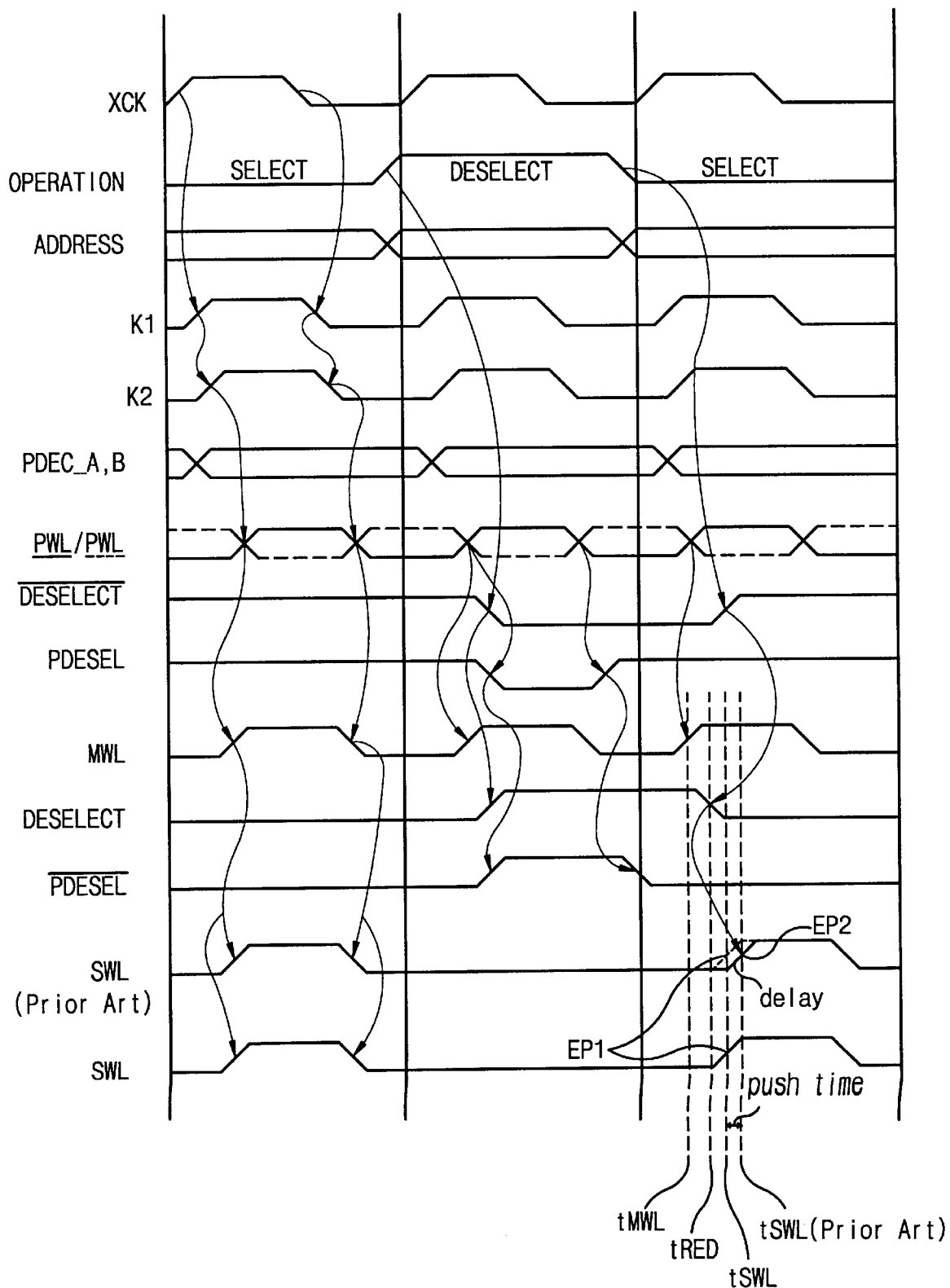
FIG. 5 is a timing diagram illustrating an operation of the synchronous memory device shown in FIGS. 3 and 4.

First row decoder 300 selects one of main word lines MWLn with decoded signals PDEC_A generated from row pre-decoder 280, responding to clock signal PWL made by clock driver 240. A selected main word line, as shown in FIG. 5, is then activated in being synchronized with clock signal PWLB which is a reverse signal of PWL, through inverter IV21. Second row decoder 320 receives decoded signals PDEC_B from row pre-decoder 180 and then generates decoding signals SC_S selecting an alternative one (e.g., SWL1) of selection word lines assigned to the previously selected main word line. Control signal generating circuit 340 receives non-selection signal DESELECTB and clock signal PW1, each provided from control logic circuit 100 and clock driver 240, and then generates control signal PDESELB for making selection word line decoder 120 be activated in a selection state or be inactivated in a non-selection state. Circuit 340 is formed of inverter IV1 receiving DESELECTB, NAND gate G1 receiving output of inverter IV1 and PWL, and inverter IV2 receiving output of NAND gate G1 and generating PDESELB.

Referring to FIG. 5, when an operation mode moves to the non-selection state from the selection state, control circuit 100 generates non-selection signal DESELECTB falling down to low level from high level. The transition of the non-selection signal, to low level, occurs late relative to that of clock signal PWL. Therefore, even though a main word line (e.g., MWL1) of non-selected bank is selected by its corresponding row address signals for a read/write operation is being carried out in a selected bank, the section word line decoder belong to the non-selected bank is disabled by control signal PDESELB which maintains high level. In the section word line decoder 120, control signal PDESELB of high level causes NMOS transistors MN1 and MN2 not to be operable of switching even when the main word line is being selected. Since a common drain node of transistors MP1 and MN1 is held in high level due to the control signal PDESELB in the non-selected bank, a voltage level of the section word line (e.g., SWL1) is set on low level not to be activated thereof.

Subsequently, when the non-selected bank goes to the selection state from the non-selection state, for which row address signals for selecting one of the section word lines are loaded on a decoding route through row pre-decoder 280, first and second row decoders, 300 and 320, responding to internal clock signals K1, K2 and PWL. At this time, irrespective of an activation of non-selection signal DESELECTB which is low level, section word line decoder 120 is settled on a stand-by state until the main and section word lines corresponding thereto are addressed in the selection state because control signal PDESELB is applied to the circuit 340 together with clock signal PWL. Thus, an activation time of the section word line assigned to a selected bank is not limited by control signal PDESELB which responds to non-selection signal DESELECTB. As shown in FIG. 5, showing the difference of activation timings between the conventional and present cases when a bank goes to a selection state from a non-selection state, the section word line decoder is set on a stand-by state by control signal PDESELB prior to an addressing for a selected section word line in the present, while the conventional has the activation time of a selected section word line, EP2, being later than a desired time EP1 due to non-selection signal DESELECTB. The present case can have the activation time EP1 for the selected section word line.

Figure 6:
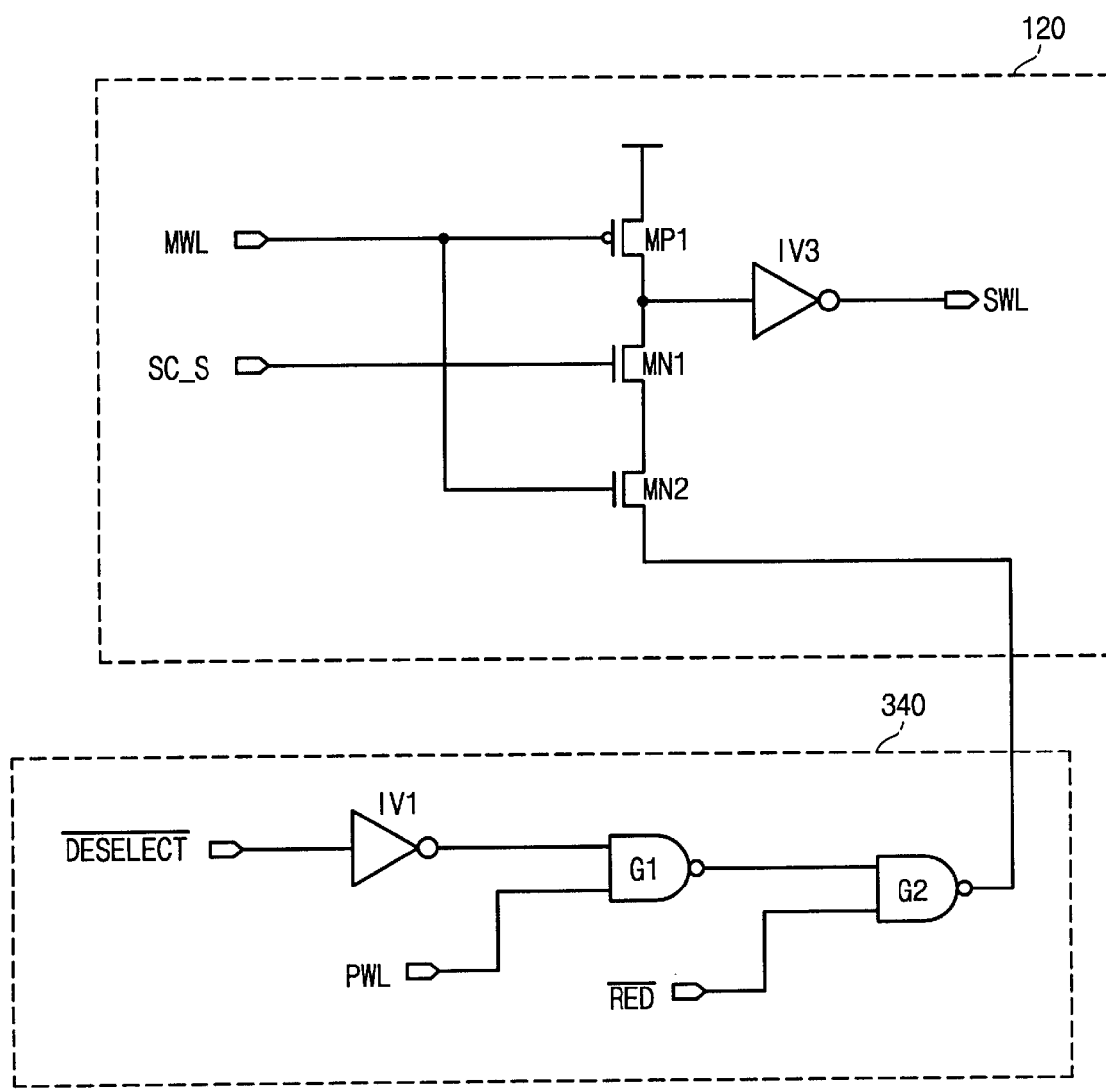
FIG. 6 illustrates another embodiment of the control signal generating circuit shown in FIG. 4.

FIG. 6 shows another available circuit configuration of the control circuit 340. Considering that a section word line addressed is finally held in a disable state when it belongs to a non-selected bank in the bank operation mode or when memory cells coupled to itself are prepared to be repaired, inverter IV2 is substituted to NAND gate G2 whose second input is repair signal REDB which retains low level in a repair operation or high level in a normal operation. The circuit of FIG. 6 makes an activation time of the section word line not be delayed due to the non-selection signal.

As described above, since a section word line decoder of a selected bank is forced to be set into a stand-by state during a cycle time of the non-selection signal when the selected bank moves to a selection state from a non-selection state, a delay in activating a section word line can be prevented thereby.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A synchronous memory device operable of responding to an external clock signal comprising:

a memory cell array having a plurality of memory cells arranged in a matrix formed of rows and columns;

a plurality of first and second word lines, a connection ratio of the first and second word lines being 1:n (n is at least greater than 1);

a clock generator for generating an internal clock signal responding to the external clock signal;

a control logic for generating an informing signal denoting a non-selection of the memory device, the informing signal responding to the internal clock signal;

a first decoder for receiving row address signals to designate one of the first word lines, and for generating a first selection signal to designate one of the second word lines and a second selection signal to designate one of the first word lines corresponding to the first word line preliminarily selected;

a control signal generating circuit for receiving the informing signal and for generating a control signal responding to the internal clock signal; and a second decoder for receiving the first and second selection signals and for selecting the first word line, when the memory device is being selected;

whereby, when the memory device goes to a selection state from a non-selection state, the control signal is enabled until the first and second selection signals are applied to the second decoder, during a cycle time of the informing signal.

2. A system having a processing unit and a cache memory at least formed of two synchronous memory devices, the synchronous memory device comprising:

a memory cell array having a plurality of memory cells arranged in a matrix formed of rows and columns;

a plurality of first and second word lines, a connection ratio of the first and second word lines being 1:n (n is at least greater than 1);

a clock generator for generating an internal clock signal responding to the external clock signal;

a control logic for generating an informing signal denoting a non-selection of the memory device, the informing signal responding to the internal clock signal;

a first decoder for receiving row address signals to designate one of the first word lines, and for generating a first selection signal to designate one of the second word lines and a second selection signal to designate one of the first word lines corresponding to the first word line which preliminarly selected;

a control signal generating circuit for receiving the informing signal and for generating a control signal responding to the internal clock signal; and a second decoder for receiving the first and second selection signals and for selecting the first word line, when the memory device is being selected;

whereby, when the memory device goes to a selection state from a non-selection state, the control signal is enabled until the first and second selection signals are applied to the second decoder, during a cycle time of the informing signal.

\* \* \* \* \*